(12) United States Patent
Estrela et al.

(10) Patent No.: US 6,490,143 B1
(45) Date of Patent: Dec. 3, 2002

(54) BLOCKING CIRCUIT FOR HIGH VOLTAGE SPIKE TESTING

(75) Inventors: Peter Estrela, Fall River, MA (US); Edward W. Wilbur, Jr., Bristol, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 99 days.

(21) Appl. No.: 09/632,003

(22) Filed: Aug. 7, 2000

(51) Int. Cl.[7] ............... H02H 7/06; H02J 1/02
(52) U.S. Cl. ............ 361/113; 307/115; 333/167
(58) Field of Search .................. 361/117, 119, 361/113, 111; 307/105; 333/167

(56) References Cited

U.S. PATENT DOCUMENTS 3,555,291 A * 1/1971 Dewey ............... 307/105
4,551,780 A * 11/1985 Canay ............... 174/DIG. 17

* cited by examiner

Primary Examiner—Kim Huynh
(74) Attorney, Agent, or Firm—Michael J. McGowan; Prithvi C. Lall; Michael F. Oglo

(57) ABSTRACT

An apparatus to provide spike conduction and power supply isolation that is effective for a 60 Hz power supply operating frequency. The power frequency blocking circuit is practically implemented for a 60 Hz power supply operating frequency. The power frequency blocking circuit provides an equivalent impedance of 100 ohms at the 60 Hz operating frequency, and the power frequency blocking circuit equivalent impedance is on the order of 1–2 ohms at frequencies above 1000 Hz where spike conduction is required. The power frequency blocking circuit is placed between each power supply terminal and ground. The circuit is comprised of a parallel combination resistor and capacitor.

4 Claims, 6 Drawing Sheets

BLOCKING CIRCUIT FOR HIGH VOLTAGE SPIKE TESTING

STATEMENT OF GOVERNMENT INTEREST

The invention described herein may be manufactured and used by or for the Government of the United States of America for governmental purposes without the payment of any royalties thereon or therefore.

BACKGROUND OF THE INVENTION (1) Field of the Invention

The present invention relates generally to a method and apparatus for testing electrical equipment, and more particularly to a method and apparatus for testing equipment for tolerance to line-to-line and line-to-ground high voltage spikes.

(2) Description of the Prior Art

Submarine power systems create intermittent high voltage spikes. Submarine equipment electrically connected to such power systems, hereinafter referred to as the "load", must tolerate these voltage spikes. The high-frequency voltage spikes are classified as line-to-line (i.e., from power line to another power line) or line-to-ground (i.e., running from power line to ground). Each scenario must, be tested to ensure that the load properly tolerates the spikes. Spike tolerance test circuitry includes power frequency blocking circuits that provide low impedance at the higher spike frequencies and limit the power dissipated by the power source through the power frequency blocking circuitry.

To ensure that the load is capable of withstanding the spikes, a spike generator is connected to the equipment under test through power frequency blocking circuitry. Existing power frequency blocking circuitry comprises a RLC circuit with high impedance, or resonance, at the power supply fundamental frequency to limit the power through the line-to-line and line-to-ground connections from the power source; however, this same RLC circuit presents extremely low impedance at the higher, spike frequencies to allow spike conduction to the load.

During submarine equipment spike testing, RLC power frequency blocking circuitry is placed between all power lines and ground. Since submarine power devices are traditionally operated at 400 Hz, the RLC power frequency blocking circuitry provides resonance, or maximum impedance, at the 400 Hz fundamental operational frequency; however, submarine power devices having a 60 Hz fundamental operational frequency are now being utilized. Because the inductor for a RLC power frequency blocking circuit with 60 Hz resonance requires an inductor size approaching a 55-gallon barrel, the typical RLC power frequency blocking circuit cannot be practically implemented for 60 Hz operation. Additionally, such RLC design for 60 Hz operation provides a frequency response with an extremely high Q (ratio of peak (resonant) frequency to half-power bandwidth) that would require unrealistically accurate components to maintain 60 Hz resonance.

There is currently not a practically implemented power frequency blocking circuit for spike testing, with 60 Hz resonance that provides equivalent performance to traditional 400 Hz RLC power frequency blocking circuitry. What is needed is a practically implemented circuit that provides high impedance at 60 Hz, and low impedance at the higher spike frequencies to conduct the voltages from the spike generator to the test equipment, while also protecting the power supply.

SUMMARY OF THE INVENTION

It is a general purpose and object of the present invention to provide power frequency blocking circuitry for a system with a 60 Hz power supply operating frequency. It is a further object of the present invention to provide such spike test support using circuit components that are practically implemented. It is yet another object of the present invention to present a circuit with high impedance at 60 Hz, and low impedance at higher frequencies typical of line-to-line and line-to-ground spikes.

Other objects and advantages of the present invention will become more obvious hereinafter in the specification and drawings.

These objects are accomplished with the present invention by a circuit consisting of a parallel combination resistor and capacitor. The circuit provides power line-to-line power frequency blocking for a 60 Hz power supply operating frequency. The power frequency blocking circuit provides an equivalent impedance of 100 ohms from power line to ground at the 60 Hz operating frequency; and, the power frequency blocking circuit equivalent impedance is on the order of 1–2 ohms at frequencies above 1000 Hz where spike conduction is required. The power frequency blocking circuit is placed between each power supply terminal and ground.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings, wherein like reference numerals refer to like parts and wherein.

DESCRIPTION OF THE PREFERRED EMBODIMENT

Figure 1:
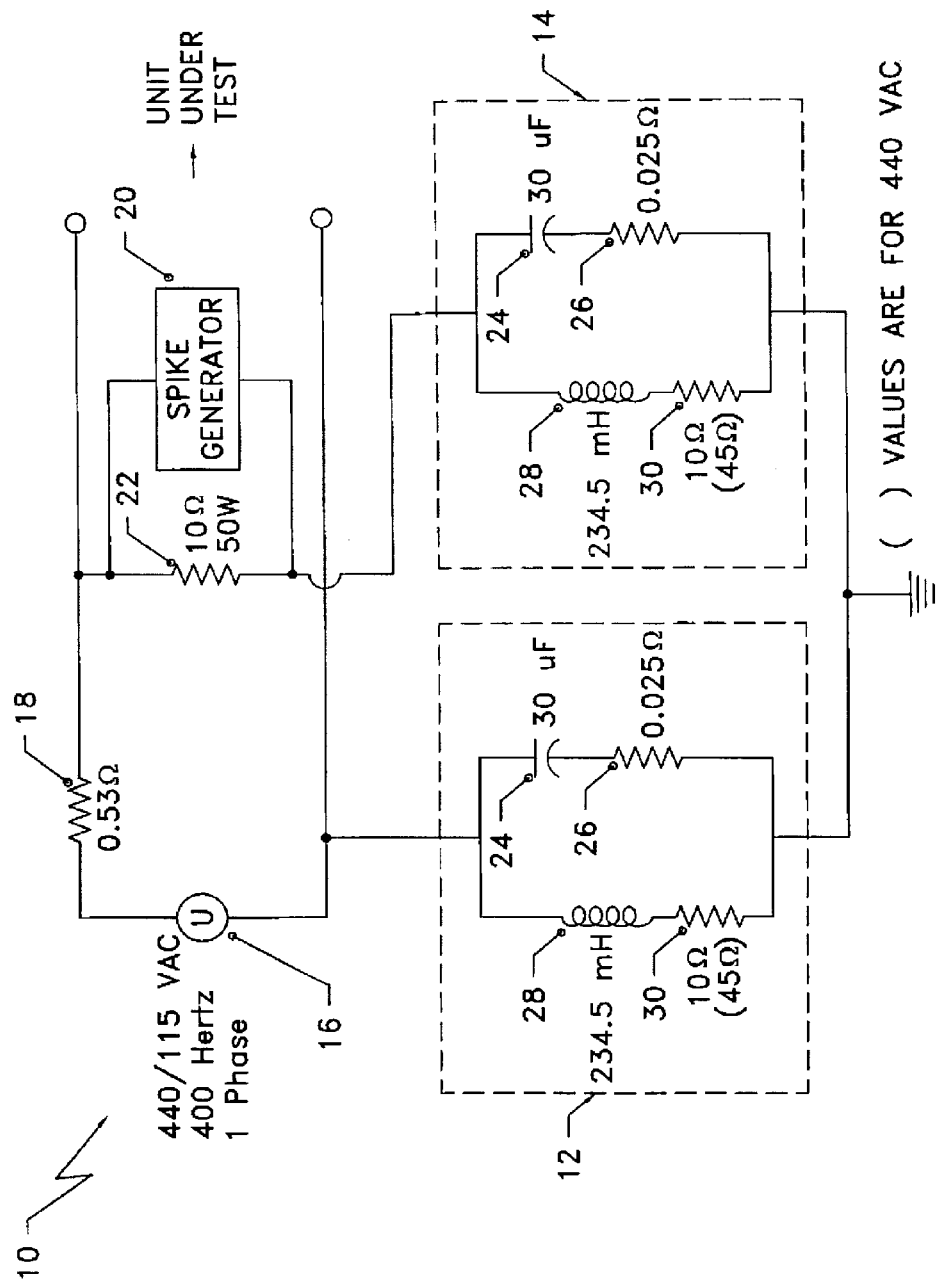
FIG. 1 is a circuit diagram of the original, RLC power frequency blocking test configuration for 400 Hz power supply (resonance) is shown as prior art.

Referring now to FIG. 1, there is shown a circuit diagram 10 for spike testing. FIG. 1 RLC power frequency blocking circuits 12, 14 provide maximum impedance, or resonance, at the power supply 16 400 Hz operating frequency. The power supply 16 operates at either 440 Vac (rms) or 115 Vac (rms), with the power supply 16 external resistance modeled as 0.53 ohms 18. The spike generator 20 is modeled with an external resistance 22 of 10 ohms with a 50 Watt rating. Two RLC power frequency blocking circuits 12, 14 are connected between power supply 16 and ground for each line of the alternating current power supply 16. The RLC power frequency blocking circuits 12, 14 consist of a 30 microfarad capacitor 24 having an effective series resistance of 0.025 ohm 26, in parallel with a series combination 234.5 milli-Henry inductor 28 and 10 ohm resistor 30. The 10 ohm resistor 30 is for power supply operation at 115 Vac (rms), while the 10 ohm resistor 30 is replaced with a 45 ohm resistor 30 for power supply operation at 440 Vac (rms).

Figure 2:
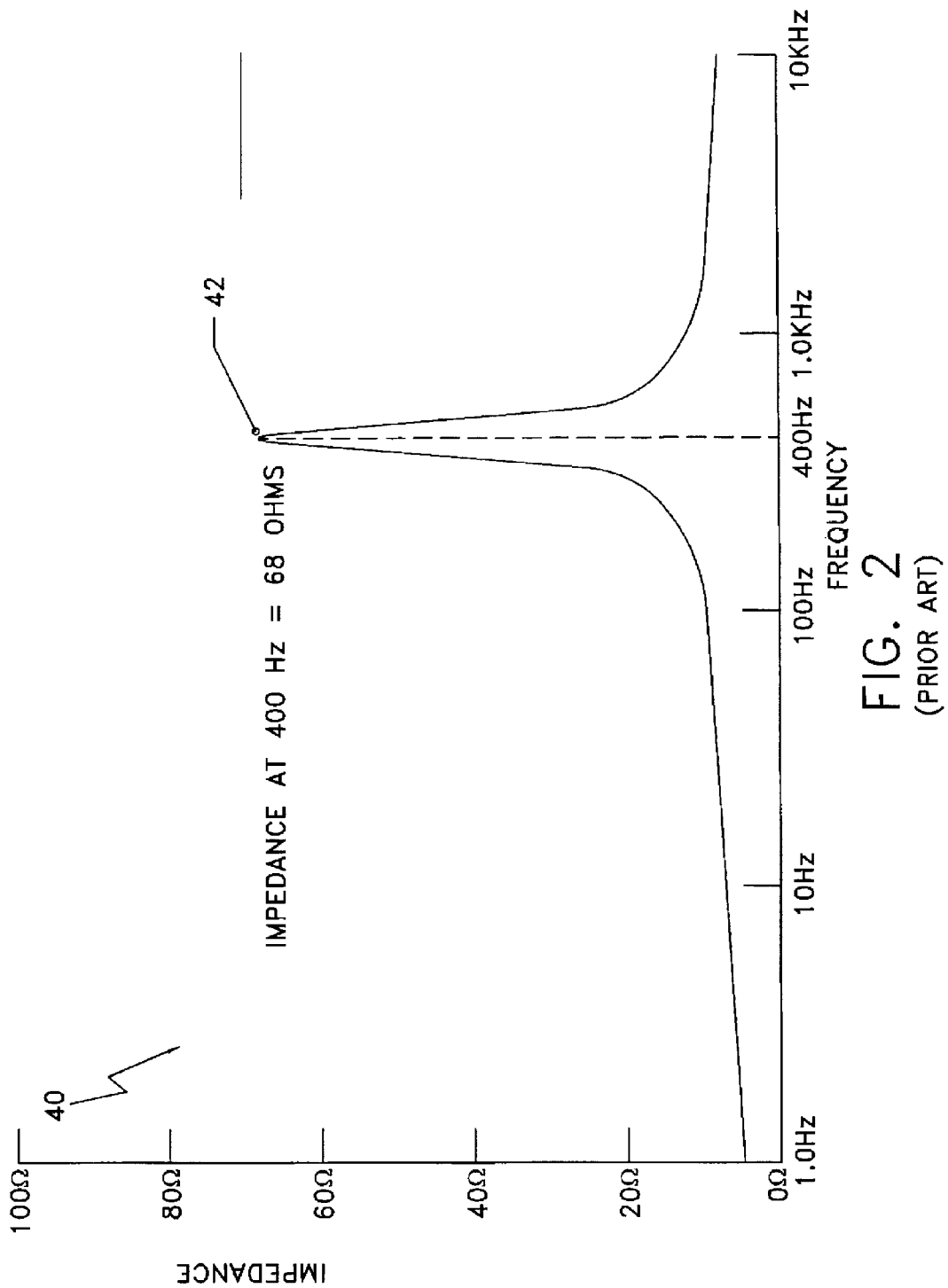
FIG. 2 is a plot of the frequency response of the RLC power frequency blocking circuit shown in FIG. 1.

Referring now to FIG. 2, there is shown a plot 40 of the power frequency blocking circuitry frequency response. The frequency scale is logarithmic. FIG. 2 indicates that maximum impedance 42, or resonance, occurs when power supply has operating frequency at 400 Hz. At 400 Hz, the impedance 42 is 68 ohms, and beyond the range of 100 Hz through 1050 Hz, the impedance is less than 5 ohms. At line-to-line or line-to-ground spike frequencies greater than 1 KHz, the impedance is on the order of 1–2 ohms. Spike testing in submarine applications typically occurs at frequencies on the order of 20 KHz.

Figure 3:
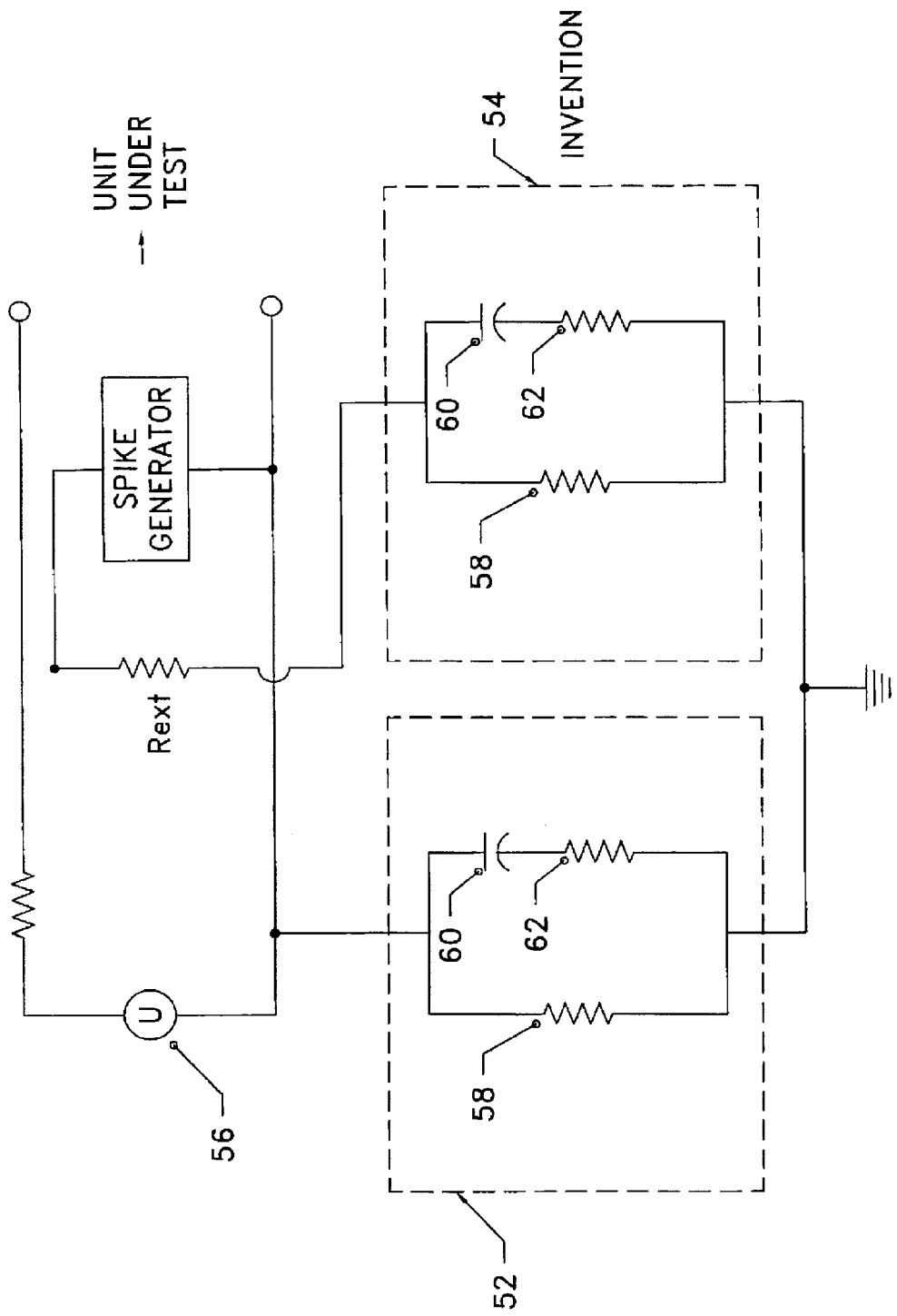
FIG. 3 is a circuit diagram for the RC invention for single phase power.

Referring now to FIG. 3, there is shown the spike test configuration containing the invention for a power frequency blocking circuit. As in FIG. 1, FIG. 3 power frequency blocking circuits 52, 54 are connected between power supply 56 and ground for both lines of the alternating current power supply. As opposed to traditional RLC power frequency blocking circuitry, however, FIG. 3 power frequency blocking circuitry 52, 54 does not utilize an inductor to create resonance and high impedance at the 60 Hz operational frequency. The FIG. 3 power frequency blocking circuitry 52, 54 comprises a resistor and capacitor.

The invention power frequency blocking circuits 52 and 54 include a 250 Watt 400 ohm resistor 58 in parallel with a 10 microfarad capacitor 60 that has an effective series resistance of .025 ohm 62. The 400 ohm resistor 58 is utilized for power supply operation 56 at 440 Vac (rms). For power supply 56 operation at 115 Vac (rms), the 400 ohm resistor 58 is replaced with a 200 ohm 50 Watt resistor 58.

Figure 4:
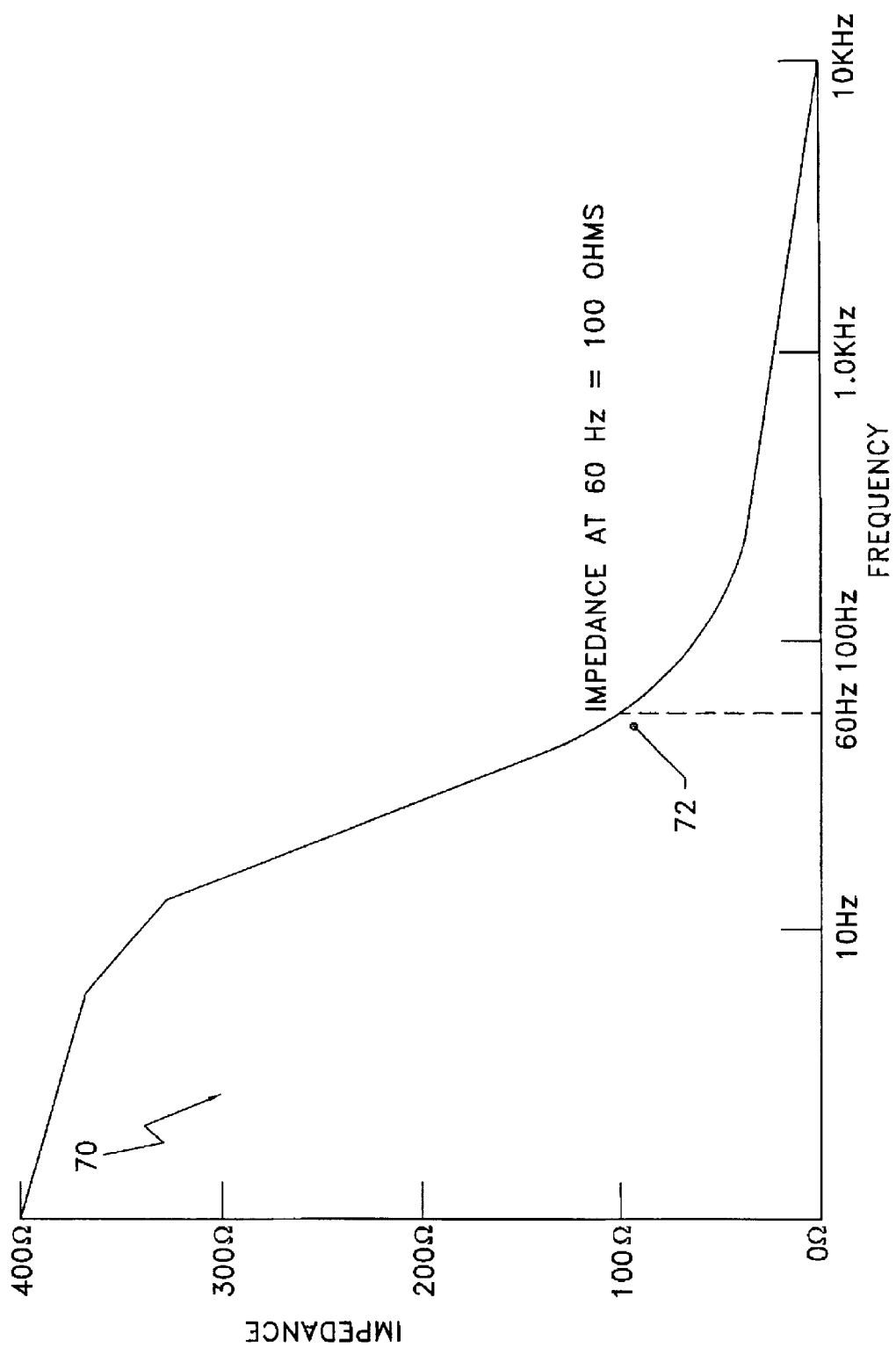
FIG. 4 is a plot of the frequency response for the power frequency blocking circuit of FIG. 3 for 115 Vac (rms)

Referring now to FIG. 4, there is shown a plot 70 of impedance versus frequency for the invention power frequency blocking circuitry for power supply operation at 115 Vac (rms). At the 60 Hz operational frequency 72, the power frequency blocking circuit equivalent impedance is 100 ohms. For frequencies less than the 60 Hz operational frequency, the impedance is greater than 100 ohms to a maximum 400 ohm. As FIG. 4 indicates, for higher frequencies that are the concern in spike testing, the power frequency blocking circuit equivalent impedance is on the order of 1–2 ohms, thereby providing a virtual short circuit to conduct the high current produced by a voltage spike.

Figure 5:
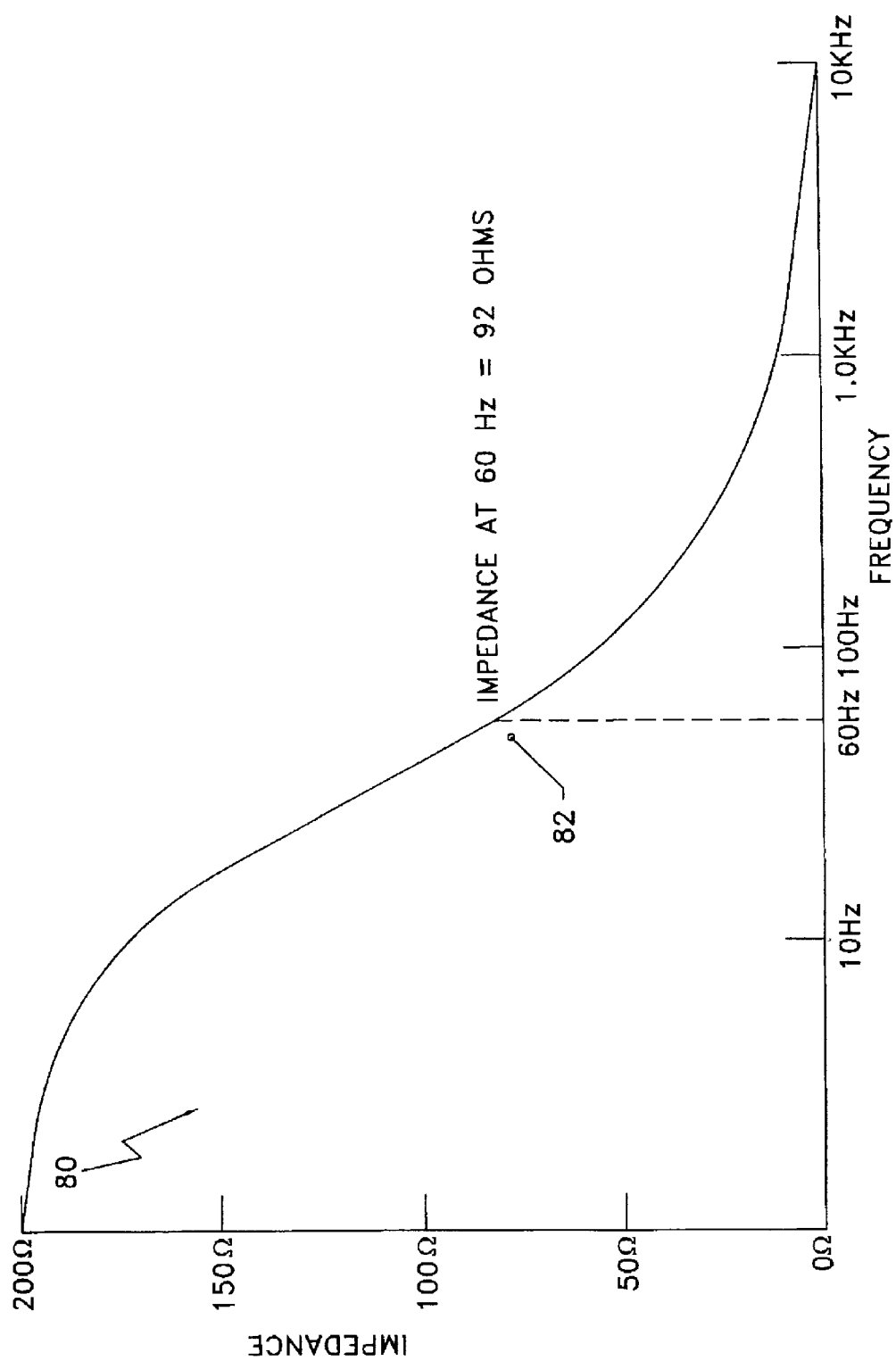
FIG. 5 is a plot of the frequency response for the power frequency blocking circuit of FIG. 3 for 440 Vac (rms); and, FIG. 6 is a circuit diagram for the RC power frequency blocking test circuit invention for three-phase power configurations.

Referring now to FIG. 5, there is shown the frequency plot 80 for the power frequency blocking circuit invention for a power supply operating at 440 Vac (rms). The power frequency blocking circuit equivalent impedance at 60 Hz 82 is 92 ohms, with greater impedance values at lower frequencies to a maximum of 200 ohms line-to-ground, or 400 ohms line-to-line. For higher frequencies in the voltage spike range, the power frequency blocking circuit equivalent impedance is once again on the order of 1–2 ohms.

Figure 6:
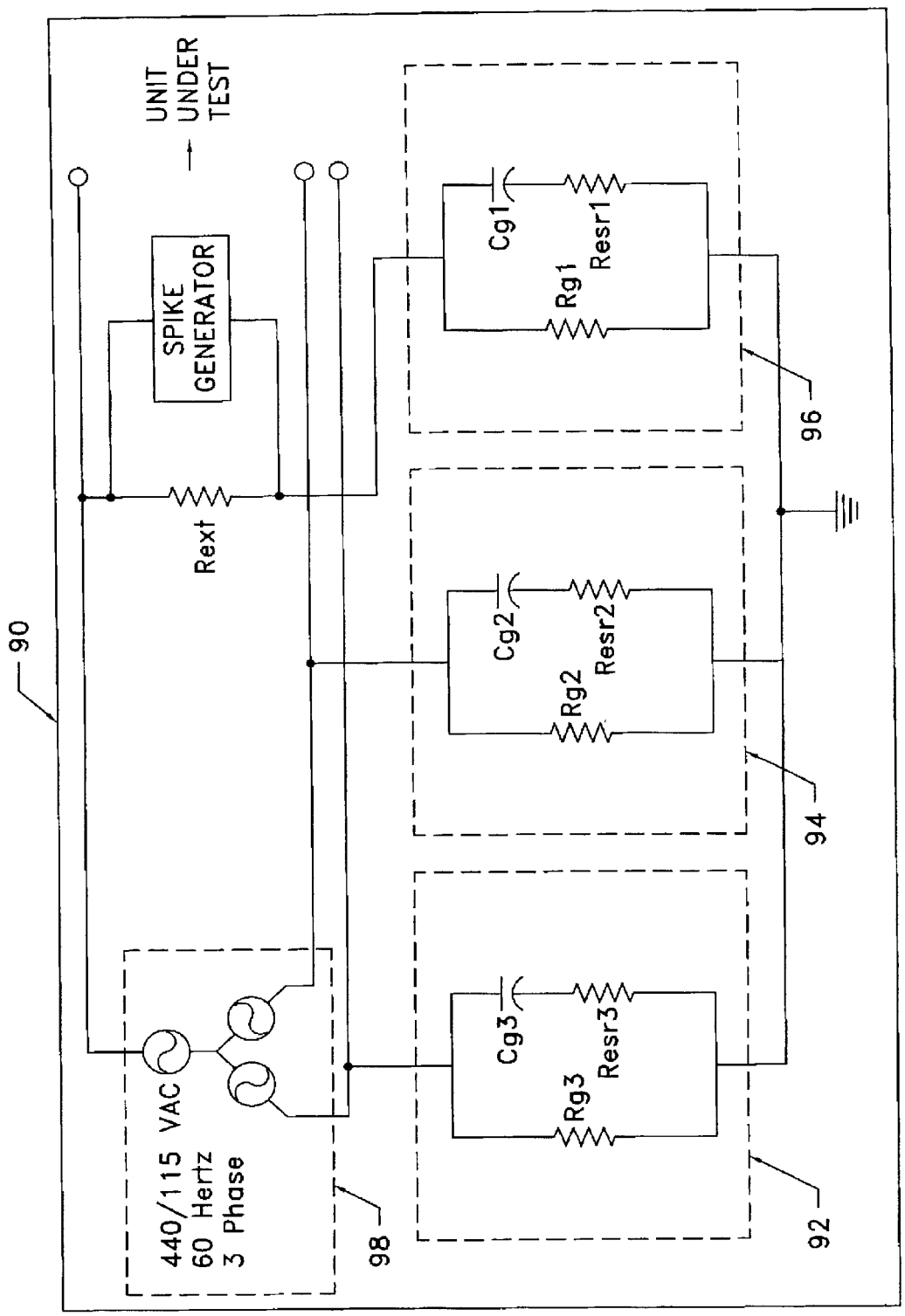

Referring now to FIG. 6, there is shown the power frequency blocking circuit 90 for three-phase power sources. The power frequency blocking circuits 92, 94, 96 are placed between the power supply 98 and ground on all three power supply terminals.

The advantage of the present invention over the prior art is that the invention provides equivalent power frequency blocking for circuits with a 60 Hz operating frequency without requiring inductors. Effective spike testing can therefore be performed using practical components.

What has thus been described is a power frequency blocking circuit that is practically implemented for a 60 Hz power supply operating frequency. The power frequency blocking circuit provides an equivalent impedance of 100 ohms at the 60 Hz operating frequency, and the power frequency blocking circuit equivalent impedance is on the order of 1–2 ohms at frequencies above 1000 Hz where spike conduction is required. The power frequency blocking circuit is placed between each power supply terminal and ground. The circuit is comprised of a parallel combination resistor and capacitor.

Although the present invention has been described relative to a specific embodiment thereof, it is not so limited. Obviously many modifications and variations of the present invention may become apparent in light of the above teachings. For example, resistors with different power ratings may be used.

Many additional changes in the details, materials, steps and arrangement of parts, herein described and illustrated to explain the nature of the invention, may be made by those skilled in the art within the principle and scope of the invention. It is therefore understood that within the scope of the appended claims, the invention may be practiced otherwise than as specifically described.

What is claimed is:

1. A power frequency blocking circuit for a 60 Hz single phase power supply with a first terminal and a distinct second terminal and 440 Vac (rms) output power, comprising:

a first 200 ohm resistor;

means for connecting said first 200 ohm resistor between said first power supply terminal and ground;

a first 10 microfarad capacitor having an-effective series resistance of 0.025 ohm;

means for connecting said first 10 microfarad capacitor between said first power supply terminal and ground;

a second 200 ohm resistor;

means for connecting said second 200 ohm resistor between said second power supply terminal and ground;

a second 10 microfarad capacitor having an effective series resistance of 0.025 ohm; and means for connecting said second 10 microfarad capacitor between said second power supply terminal and ground;

said resistors and said capacitors functioning in an inductor-free circuit environment.

2. A power frequency blocking circuit for a 60 Hz single phase power supply with positive and negative terminals and 115 Vac (rms) output power, comprising:

a first 400 ohm resistor;

means for connecting said first 400 ohm resistor between said first power supply terminal and ground;

a first 10 microfarad capacitor having an effective series resistance of 0.025 ohm;

means for connecting said first 10 microfarad capacitor between said first power supply terminal and ground;

a second 400 ohm resistor;

means for connecting said second 400 ohm resistor between said second power supply terminal and ground;

a second 10 microfarad capacitor having an effective series resistance of 0.025 ohm; and means for connecting said second 10 microfarad capacitor between said second power supply terminal and ground; said resistors and said capacitors functioning in an inductor-free circuit environment.

3. A power frequency blocking circuit for a 60 Hz three phase power supply and 440 Vac (rms) output power, comprising:

a first 200 ohm resistor;

means for connecting said first 200 ohm resistor between said first phase of said three phase power supply and ground;

a first 10 microfarad capacitor having an effective series resistance of 0.025 ohm;

means for connecting said first 10 microfarad capacitor between said first phase of said three phase power supply and ground;

a second 200 ohm resistor;

means for connecting said second 200 ohm resistor betweens said second phase of said three phase power supply and ground;

a second 10 microfarad capacitor having an effective series resistance of 0.025 ohm;

means for connecting said second 10 microfarad capacitor between said second phase of said three phase power supply and ground;

a third 200 ohm resistor;

means for connecting said third 200 ohm resistor between said third phase of said three phase power supply and ground;

a third 10 microfarad capacitor having an effective series resistance of 0.025 ohm; and means for connecting said third 10 microfarad capacitor between said third phase of said three phase power supply and ground;

said resistors and said capacitors functioning in an inductor-free circuit environment.

4. A power frequency blocking circuit for a 60 Hz three phase power supply and 115 Vac (rms) output power, comprising:

a first 400 ohm resistor;

means for connecting said first 400 ohm resistor between said first phase of said three phase power supply and ground;

a first 10 microfarad capacitor having an effective series resistance of 0.025 ohm;

means for connecting said first 10 microfarad capacitor between said first phase of said three phase power supply-and ground;

a second 400 ohm resistor;

means for connecting said second 400 ohm resistor between said second phase of said three phase power supply and ground;

a second 10 microfarad capacitor having an effective series resistance of 0.025 ohm;

means for connecting said second 10 microfarad capacitor between said second phase of said three phase power supply and ground;

a third 400 ohm resistor;

means for connecting said third 400 ohm resistor between said third phase of said three phase power supply and ground;

a third 10 microfarad capacitor having an effective series resistance of 0.025 ohm; and means for connecting said third 10 microfarad capacitor between said third phase of said three phase power supply and ground;

said resistors and said capacitors functioning in an inductor-free circuit environment.

\* \* \* \* \*